(12) United States Patent
Nanbu et al.

(10) Patent No.: US 6,812,151 B1
(45) Date of Patent: Nov. 2, 2004

(54) METHOD OF ETCHING

(75) Inventors: Kenichi Nanbu, Sendai (JP); Tamotsu Morimoto, Kita-koma-gun (JP)

(73) Assignees: Kenichi Nanbu, Miyagip-Ken (JP); Tokyo Electron Limited, Tokyo-To (JP)

( * ) Notice: Subject to any disclaimer, the term of this patent is extended or adjusted under 35 U.S.C. 154(b) by 1024 days.

(21) Appl. No.: 09/233,073

(22) Filed: Jan. 19, 1999

(30) Foreign Application Priority Data

Mar. 18, 1998 (JP) .......................................... 10/089421

(51) Int. Cl.[7] .......................................... H01L 21/302
(52) U.S. Cl. ..................... 438/706; 438/710; 438/712; 438/720; 156/345.48
(58) Field of Search ............................... 438/706, 710, 438/712, 720, 723; 156/345, 345.35, 345.36, 345.39, 345.48, 656, 655

(56) References Cited

U.S. PATENT DOCUMENTS

| | | | |
|---|---|---|---|
| 5,338,398 A | * 8/1994 | Szwejkowski et al. | 438/720 |
| 5,556,501 A | * 9/1996 | Collins et al. | 156/345.38 |
| 5,593,540 A | * 1/1997 | Tomita et al. | 156/643.1 |
| 5,792,272 A | * 8/1998 | Van Os et al. | 118/723 R |

OTHER PUBLICATIONS

Two–Dimensional Modeling of High Plasma Density Inductively Coupled Sources for Materials Processing, J. Vac Sci. Technol. B 12(1), Jan./Feb. 1994, pp. 461–476.

"Hybrid Plasma Equipment Model Inductively Coupled Plasma Reactive Ion Etching Reactors" Computational Optical and Discharge Physics, University of Illinois College of Engineering, pp. 1–4 (date not designated).

* cited by examiner

Primary Examiner—Lan Vinh
(74) Attorney, Agent, or Firm—Smith, Gambrell & Russell

(57) ABSTRACT

An etching method is carried out by an etching system comprising a gas supply port for supplying an etching gas, a plasma producing vessel defining a plasma producing chamber in which the etching gas is converted into a plasma to produce radicals, a reaction vessel connected to the plasma producing vessel and defining a reaction chamber of a diameter greater than that of the plasma producing chamber, a support table placed in the reaction chamber to support an object to be processed to be etched by the radicals flowing down thereto from the plasma producing chamber, and a vacuum exhaust system for evacuating the reaction chamber. The etching gas is supplied through the etching gas supply port at an etching gas supply rate of 8.4 sccm or above per a substantial volume of one liter of the reaction chamber.

34 Claims, 9 Drawing Sheets

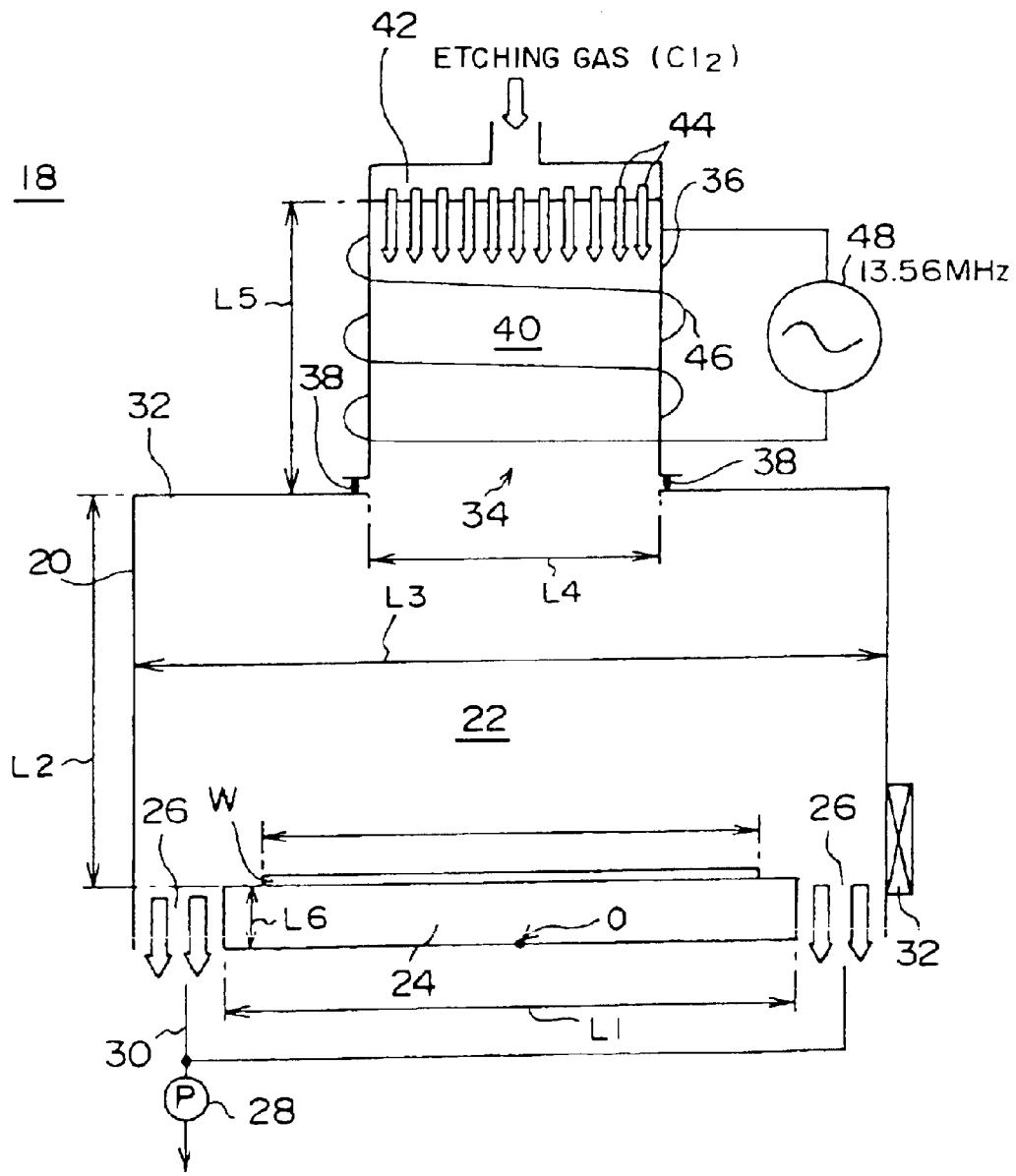
F I G. 1

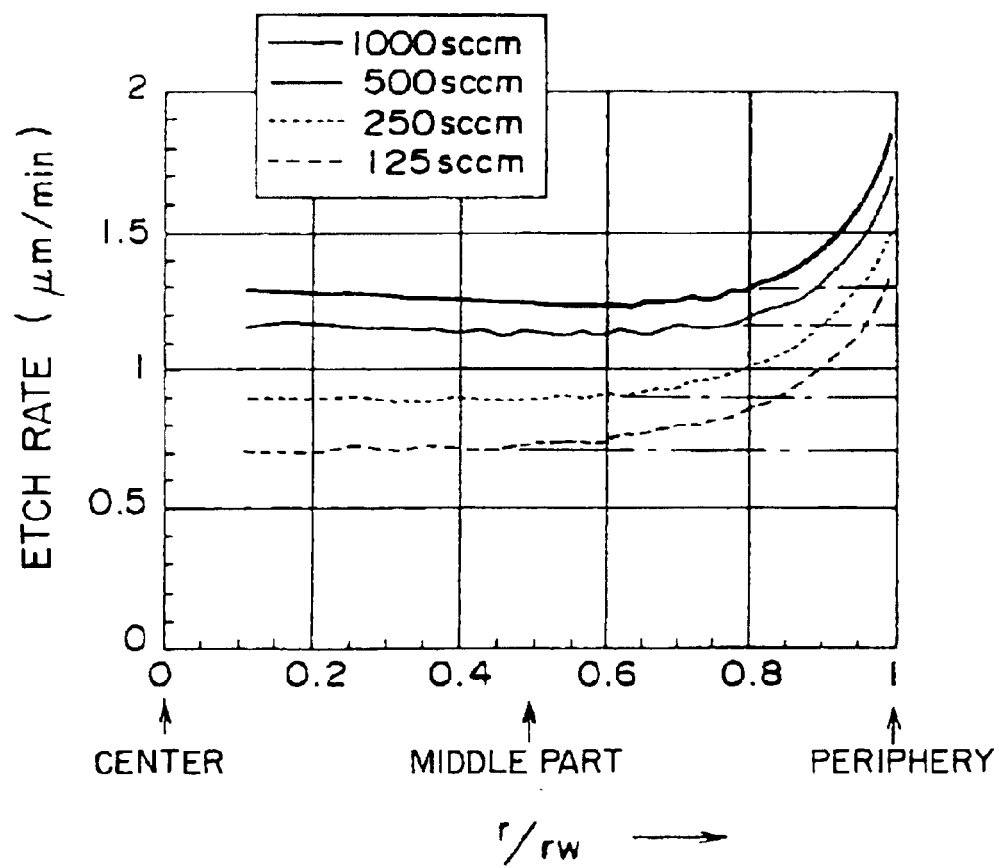
F I G. 3

| SUPPLY RATE.(sccm) | total (Pa) | Cl₂(Pa) | Cl(Pa) | SiCl₂(Pa) |
|---|---|---|---|---|
| 1000 | 0.447 | 0.211 | 0.243 | 0.0228 |
| 500 | 0.477 | 0.229 | 0.226 | 0.0223 |
| 250 | 0.478 | 0.201 | 0.231 | 0.0459 |
| 125 | 0.479 | 0.170 | 0.224 | 0.0858 |

FIG. 5

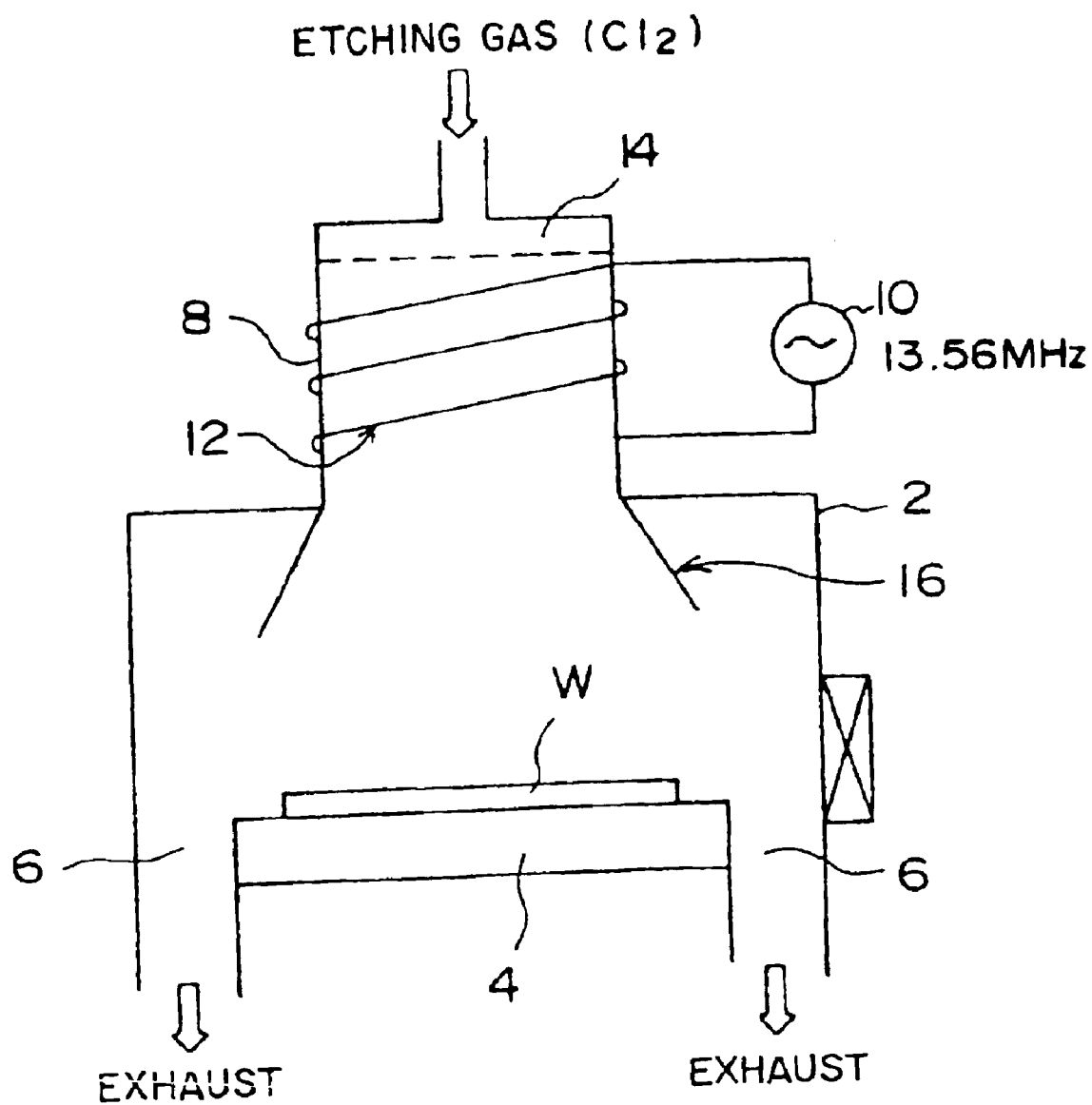
F I G. 9

METHOD OF ETCHING

BACKGROUND OF THE INVENTION

The present invention relates to a method of etching a thin film, such as a polysilicon film.

Generally, film forming processes for forming films on a semiconductor wafer or a glass substrate and etching process for pattering the films are carried out alternately to form a desired number of devices when fabricating a semiconductor integrated circuit or a LCD panel.

When forming, for example, a MOSFET (Metal Oxide Semiconductor Field Effect Transistor), an etching process for etching a polysilicon film in forming the gate electrode of the MOSFET is very important because the length of the gate electrode of the MOSFET is an important factor dominating the electric characteristic of the MOSFET. Accordingly, the polysilicon film must be etched over the entire surface of the wafer to form the gate electrode in an accurate length, which requires highly accurate, uniform processing.

In most cases, an inductive coupled plasma processing system capable of operating at a low process pressure on the order of several mTorrs is employed for carrying out a polysilicon film etching process because the process pressure of a conventional diode parallel-plate plasma etching system is excessively high and the diode parallel-plate plasma etching system is unable to etch the surface of the polysilicon film in a sufficiently high uniformity.

FIG. 9 is a typical view of a generally known inductive coupled plasma processing system. The inductive coupled plasma processing system has a substantially cylindrical processing vessel 2 defining a reaction chamber. A wafer table 4 is placed in the processing vessel 2 to support a semiconductor wafer W thereon. The interior space of the processing vessel 2 is evacuated through an annular exhaust opening formed in the bottom of the processing vessel 2 so as to surround the wafer table 4.

A plasma producing vessel 8 of a diameter smaller than that of the top wall of the processing vessel 2 is joined to the top wall of the processing vessel 2 so as to open into the reaction chamber. The plasma vessel 8 defines a plasma producing chamber. An induction coil 12 is mounted on the plasma producing vessel 8 and is connected to, for example, a 13.56 MHz radio frequency power source 10.

An etching gas, such as chlorine gas ($Cl_2$), supplied through a gas inlet part 14 formed on the top wall of the plasma producing vessel 8 is ionized by an electromagnetic field created by an induction coil 12 to produce a plasma. Chlorine molecules or chlorine atoms are activated by the plasma to produce radicals. Chlorine gas is supplied into the plasma producing chamber at a flow rate of about 125 sccm when the volume of the plasma producing chamber is 59 litters. The radicals flow from the plasma producing chamber into the reaction chamber of the processing vessel 2. The radicals are guided and dispersed by a tapered guide plate 16 so as to fall evenly on the surface of the wafer W to etch, for example, a polysilicon film formed over the surface of the wafer W.

The behavior or flow of the gas or radicals flowing from the plasma producing vessel 8 into the processing vessel 2 in an evacuated atmosphere of a pressure on the order of several mTorrs is very complicated. It has been a common knowledge that radicals spread by diffusion in an atmosphere of such a low pressure and fall substantially uniformly on the surface of the wafer W.

However, when a film formed on a wafer is etched by the foregoing etching method, the difference between an etch rate in a peripheral part of the wafer and an etch rate in a central part of the wafer is considerably large and, in some cases, the film formed on the surface of the wafer cannot uniformly be etched. Irregularity in etch rate in the surface of a wafer is not a significant problem with 6 in. and 8 in. wafers, but is a significant problem with 12 in. (30 cm) wafers, and a film formed on such a large-diameter wafer cannot be etched in a desired uniformity.

SUMMARY OF THE INVENTION

The present invention has been made in view of the foregoing problems and it is therefore an object of the present invention to provide an etching method capable of etching a film formed on a surface of a wafer at greatly improved uniform etch rate.

The inventors of the present invention simulated flows of etching gases and radicals, in which gas supply rate was varied in a wide range, and found that the flux by diffusion on a peripheral part of a wafer is not changed significantly but the flux by flow is changed greatly by flow, and the uniformity of etch rate over the surface of the wafer can be improved when the etch gas is supplied at a high etching gas supply rate. The present invention has been made on the basis of such a knowledge acquired through simulation.

According to one aspect of the present invention, an etching method comprises an etching gas supply step of supplying an etching gas through a gas supply port into a plasma producing chamber, a plasma producing step of producing radicals in the plasma producing chamber by converting the etching gas into a plasma by applying radio frequency power to the etching gas, and an etching step of etching an object to be processed in a reaction chamber, which is connected to the plasma producing chamber and is evacuated, by the radicals flowing from the plasma producing chamber into the reaction chamber, in which the etching gas is supplied through the gas supply port at an etching gas supply rate of 8.4 sccm or above for a substantial volume of one liter of the reaction chamber.

The supply of the etching gas at 8.4 sccm or above for one liter of substantial volume of the reaction chamber improves the uniformity of etching over the surface of the object to be processed as well as etch rate.

In this etching method, the plasma producing step may convert the etching gas into a plasma by inductive coupling using an induction coil and the etching step may use, for example, chlorine gas as the etching gas and may etch a polysilicon film formed on the object to be processed by using chlorine gas.

BRIEF DESCRIPTION OF THE DRAWINGS

FIG. 1 is a diagrammatic view of an etching system for carrying out an etching method in a preferred embodiment according to the present invention;

FIG. 3 is a graph showing the variation of etch rate with the flow rate of an etching gas;

FIG. 5 is a table of total pressure and partial pressure of an etching gas for etching gas supply rates;

FIG. 9 is a typical view of a generally known inductive coupled plasma processing system.

DESCRIPTION OF THE PREFERRED EMBODIMENTS

Figure 2:
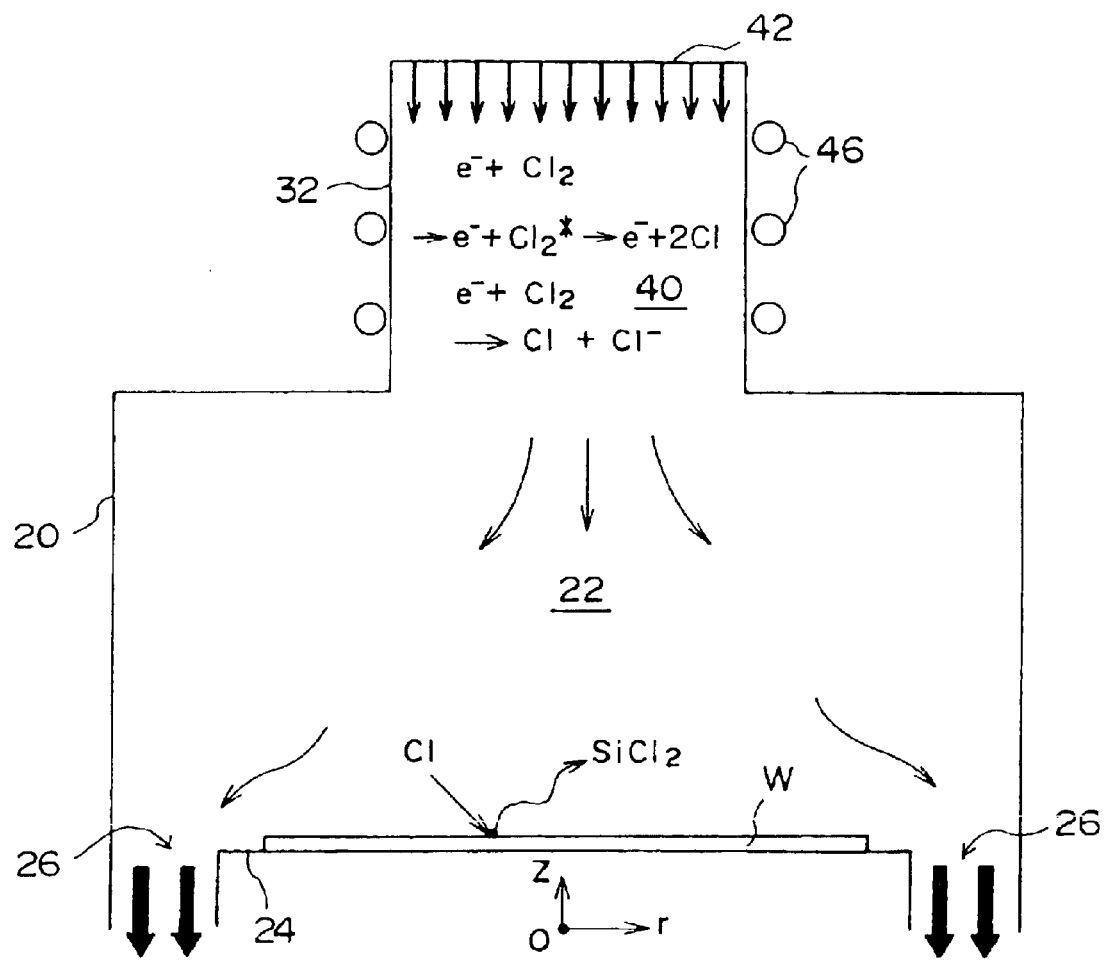
FIG. 2 is a diagrammatic view of assistance in explaining the reaction of an etching gas in the etching system shown in FIG. 1.

An etching method in a preferred embodiment according to the present invention and an etching system for carrying out the same will be described with reference to the accompanying drawings. FIG. 1 is a diagrammatic view of a plasma processing system, for carrying out an etching method in a preferred embodiment according to the present invention, FIG. 2 is a diagrammatic view of assistance in explaining the reaction of an etching gas in the etching process, and FIG. 3 is a graph showing the variation of etch rate with the flow rate of an etching gas.

Referring to FIG. 1, a plasma etching system 18 has a substantially cylindrical processing vessel 20 made of, for example, aluminum, defining a reaction chamber 22 therein. A circular support table 24 made of, for example, a metal or an insulating material for supporting an object to be processed, such as a semiconductor wafer W, thereon is placed in the processing vessel 20. The support table 24 may be provided with a resistance heater for controlling the temperature of the wafer W supported on the support table 24, and an electrode for pulling ions. An annular exhaust opening 26 is formed so as to surround the support table 24 in a bottom part of the processing vessel 20. A vacuum exhaust system 30 including a vacuum pump 28 is connected to the exhaust opening 26 to evacuate the reaction chamber 22 of the processing vessel 20. A gate valve 32 is built in a side wall of the processing vessel 20. The wafer W is carried into and carried out of the reaction chamber 22 through the gate valve 32. Lifting pins, not shown, penetrating the support table 24 in an airtight fashion move vertically when mounting the wafer W on and removing the same from the support table 24.

An opening 34 is formed in a central part of the top wall 32 of the processing vessel 20. A substantially cylindrical plasma producing vessel 36 of, for example, quartz is connected hermetically to the top wall 32 with a sealing member 38 so as to open into the opening 34. The plasma producing vessel 36 defines a plasma producing chamber 40 therein. The plasma producing chamber 40 communicates with the reaction chamber 22 of a diameter greater than that of the plasma producing chamber 40 by means of the opening 34.

A shower head 42, i.e., a gas supply unit, is disposed on an upper end of the plasma producing vessel 36. The shower head 42 is provided in its lower wall with a plurality of gas ejecting holes 44. An etching gas, such as chlorine gas (Cl$_2$) is ejected through the gas ejecting holes 44 into the plasma producing chamber 40.

A wire is wound in a predetermined number of turns around the plasma producing vessel 36 to form an induction coil 46. A radio frequency power source 48 of, for example, 13.56 MHz is connected to the induction coil 46. Radio frequency power of 13.56 MHz is supplied to the induction coil 46 to produce radicals by converting the etching gas into a plasma by inductive coupling in the plasma producing chamber 40.

Suppose that the wafer W is a 12 in. (30 cm) wafer. Then, the diameter L1 of the support table 24 is about 400 mm, the distance L2 between the top wall 32 of the processing vessel 20 and the support table 24 is about 300 mm, the inside diameter L3 of the processing vessel 20, i.e., the diameter L3 of the reaction chamber 22, is about 500 mm, the inside diameter L4 of the plasma producing vessel 36, i.e., the diameter L4 of the plasma producing chamber 40, is about 200 mm, the height L5 of the plasma producing chamber 40 is about 200 mm, and the thickness L6 of the support table 24 is about 50 mm. Therefore, the substantial volume of the reaction chamber 22 is about 59 1 (=π×250 mm×250 mm×300 mm).

An etching operation to be carried out by the thus constructed etching system will be described below. The wafer W is carried through the open/close gate valve 32 into the processing vessel 20 and is mounted on the support table 24. After the gate valve 32 is closed to seal the processing vessel 20, the etching operation is started. An etching gas, such as chlorine gas, is supplied at a predetermined etching gas supply rate through the shower head 42 disposed on the top wall of the plasma producing vessel 36 into the plasma producing chamber 40. The etching gas is converted into a plasma by an electromagnetic field created by the induction coil 46, and the plasma produces radicals of chlorine atoms and chlorine molecules.

The etching gas and the radicals diffuse from the plasma producing chamber 40 into the reaction chamber 22 underlying the plasma producing chamber 40 and larger than the plasma producing chamber 40. The etching gas and the radicals flow down onto the surface of the wafer W to etch, for example, a polysilicon film formed on a surface of the wafer W. The etching gas flows toward a peripheral part of the wafer W and is exhausted through the annular exhaust opening 26 surrounding the support table 24 by the vacuum exhaust system 30.

As shown in FIG. 2, it is considered that the chlorine gas is activated by electrons e⁻ and the activated chlorine gas reacts on silicon.

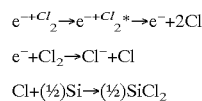

where a mark "*" indicates an electron-excited state.

According to the present invention, the process pressure is maintained at a value in the range of, for example, about 5 to about 10 mTorr and the etching gas is supplied at 500 sccm or above. A conventional etching method supplies the etching gas at an etching gas supply rate (flow rate) of about 125 sccm into a reaction chamber similar to the reaction chamber 22 having a substantial volume of about 59 1 as mentioned above. The etching method of the present invention supplies the etching gas at an etching gas supply rate of 500 sccm or above, which is far higher than the etching gas supply rate at which the conventional etching method supplies the etching gas. The etching gas supply rate of 500 sccm or above corresponds to 8.4 sccm or above for a substantial volume of one liter of the reaction chamber 22. The supply of the etching gas at such a high etching gas supply rate increases general etch rate and improves the uniformity of etching over the entire surface of the wafer.

FIG. 3 is a graph showing the variation of the distribution of etch rate on the surface of the wafer W when the etching gas supply rate supply rate of the etching gas is varied in the range of 150 to 1000 sccm in the foregoing plasma etching system. The process pressure is maintained at about 5 mTorr.

In FIG. 3, the ratio of the radial distance r from the center of the wafer W to the radius rW of the wafer W is measured to the right on the horizontal axis. As is obvious from the graph shown in FIG. 3, etch rate increases sharply in a peripheral part of the wafer W as compared with etch rate in a central part of the wafer W regardless of etching gas supply rate. When the etching gas supply rate is 125 sccm or 250 sccm, etch rate changes relatively greatly with distance from the center of the wafer W between the central part and a middle part of the wafer W and increases sharply in the peripheral part of the wafer W, and the general distribution of etch rate over the surface of the wafer W is not satisfactory.

When the etching gas supply rate is 500 sccm or 1000 sccm, etch rate changes scarcely (substantially no changes) with distance from the center of the wafer W between the central part and the middle part of the wafer W, and the increases of etch rate in the peripheral part of the wafer W is insignificant as compared with that when the etching gas supply rate is 125 sccm or 250 sccm uniform.

Thus it is observed from FIG. 3 that the uniformity of etch rate over the surface of the wafer W can greatly be improved by supplying the etching gas at an etching gas supply rate of 500 sccm or above (8.4 sccm or above per a substantial volume of one liter of the reaction chamber). The etching gas can be supplied at this etching gas supply rate when the process pressure is not higher than a plasma producing pressure of several mTorrs under which a plasma can be sustained.

The foregoing results were verified through the analysis of fields of flow of the etching gas and reaction products by simulation using a DSMC (Direct Simulation Monte Carlo) method. The results of analysis will be explained below.

Figure 4A:
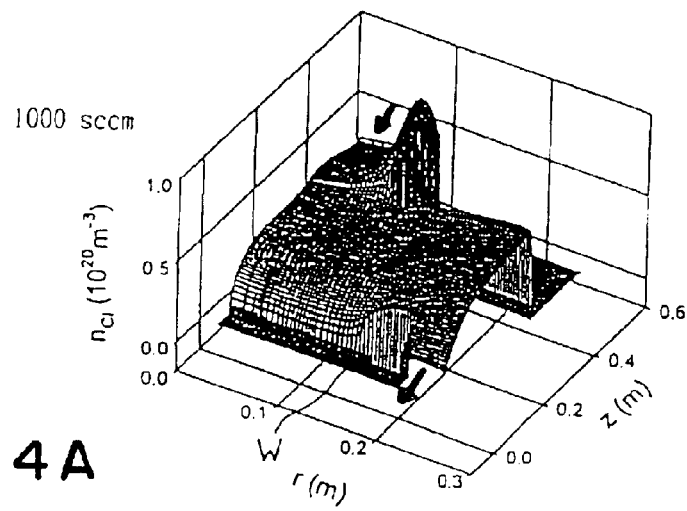
FIGS. 4A, 4B and 4C are three-dimensional graphs showing the distribution of Cl concentration in a reaction chamber.
Figure 4B:
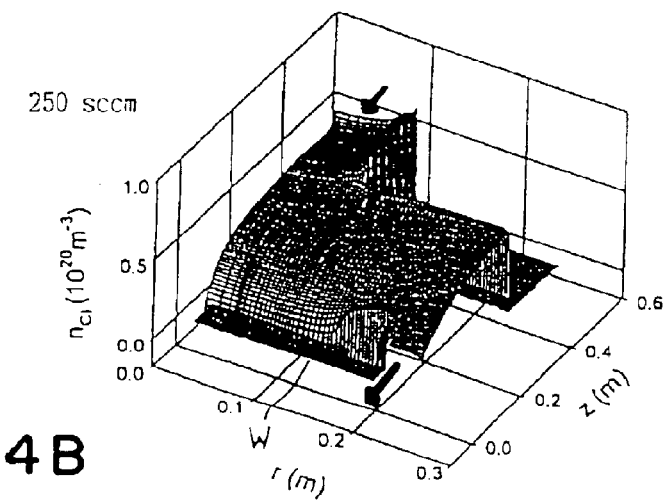
Figure 4C:
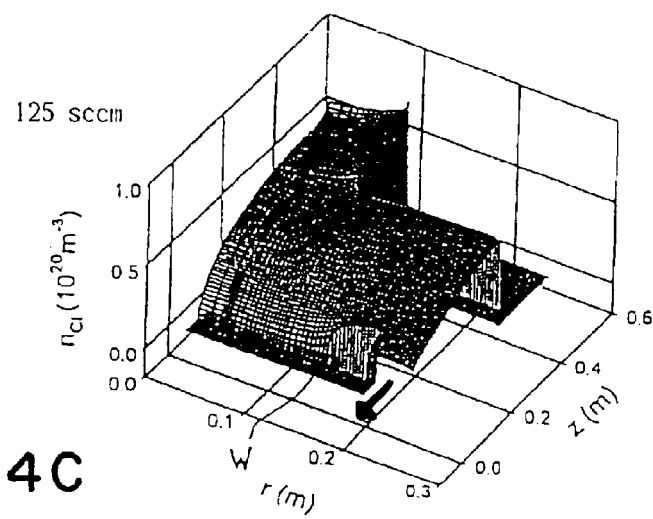

FIGS. 4A, 4B and 4C are three-dimensional graphs showing the distribution of Cl concentration in the reaction chamber, in which r is radial distance from a point O on the lower surface of the support table 24 corresponding to the center of the wafer W (FIGS. 1 and 2), Z is height from the point O, chlorine concentration (density field) is measured upward on the vertical axis. The shower head 42 is disposed at a position where Z=0.5 m.

Chlorine gas is supplied at etching gas supply rates of 1000 sccm, 250 sccm and 125 sccm for the cases shown in FIGS. 4A, 4B and 4C, respectively. In FIGS. 4A, 4B and 4C, the arrows indicate the flowing directions of the gas. Total pressure and partial pressure of the etching gas are shown in FIG. 5. FIG. 5 also provides the pressures when the etching gas supply rate is 500 sccm.

As is obvious from the graphs shown in FIGS. 4A, 4B and 4C, the flux of diffused chlorine atoms on the wafer is proportional to density gradient, and the flux increases as the etching gas supply rate increases from 125 sccm to 1000 sccm. This is the cause of increase of the etch rate with the increase of the etching gas supply rate. However, FIGS. 4A to 4C is not the sufficient explanation of the great dependence of the etch rate on the etching gas supply rate because the partial pressure of chlorine atoms at a pressure measuring point remains substantially constant regardless of the etching gas supply rate as shown in FIG. 5.

It is known from FIGS. 4A to 4C that the chlorine atom density is high in a space around the wafer. Chlorine atoms diffuse from the space around the wafer toward the peripheral part of the wafer and, therefore, the etch rate is high in the peripheral part of the wafer. However, the density gradient at a position corresponding to the boundary between the wafer and the space surrounding the wafer does not change significantly even if the etching gas supply rate is changed. Therefore, it cannot be considered that the flux of diffused chlorine atoms contributes greatly to etch rate.

Figure 6A:
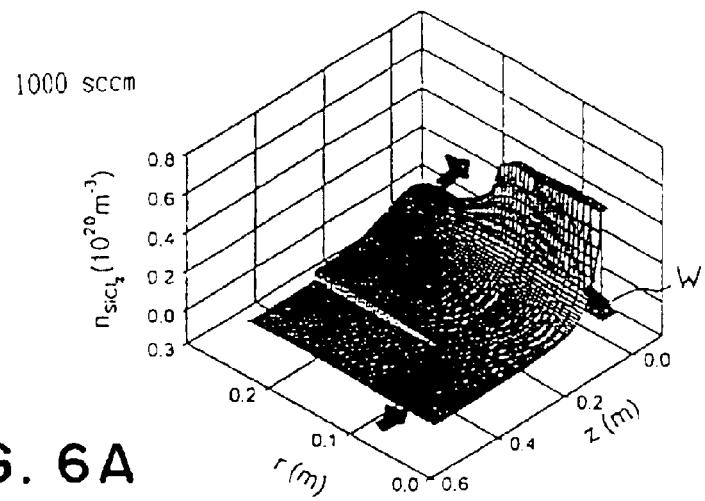
FIGS. 6A, 6B and 6C are three-dimensional graphs showing the distribution of SiCl$_2$ concentration in the reaction chamber.
Figure 6B:
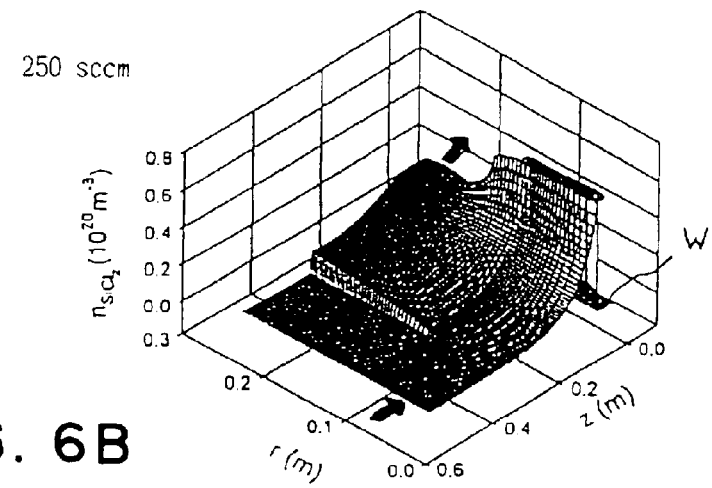
Figure 6C:
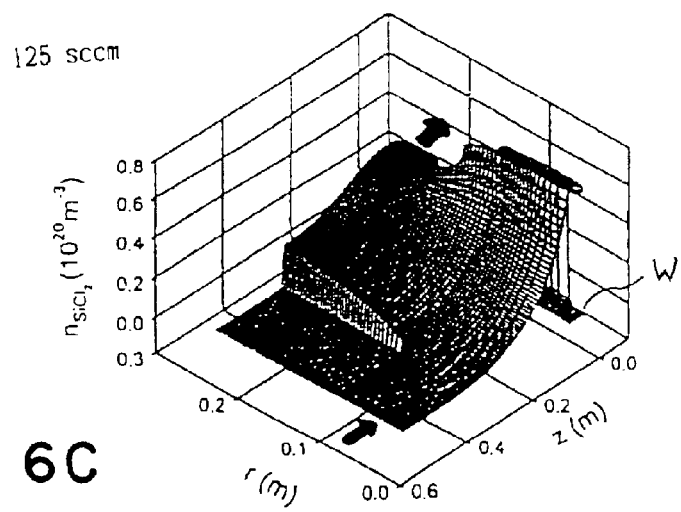

The density field of $SiCl_2$, i.e., a reaction byproduct, will be examined. FIGS. 6A, 6B and 6C are three-dimensional graphs showing the distribution of $SiCl_2$ concentration in the reaction chamber. Values measured on the axes of the graphs shown in FIGS. 6A to 6C are the same as those measured on the corresponding axes of the graphs shown in FIGS. 4A to 4C. Chlorine gas is supplied at etching gas supply rates of 1000 sccm, 250 sccm and 125 sccm for the cases shown in FIGS. 6A, 6B and 6C, respectively. Note that the directions of the r-axes and the Z-axes of the graphs shown in FIGS. 6A to 6C are opposite to those of the corresponding axes of the graphs shown in FIGS. 4A to 4C.

As is obvious from the graphs shown in FIGS. 6A to 6C, the surface of a wafer is coated with a thin $SiCl_2$ layer in every case. The thickness of the $SiCl_2$ layer decreases gradually and the quantity of $SiCl_2$ in the reaction chamber decreases as the etching gas supply rate is increased from 125 sccm toward 1000 sccm. When the $SiCl_2$ layer is thin, chlorine atoms serving as etchant are able to reach the surface of the wafer easily; that is, the rate of supply of the etchant onto the surface of the wafer increases with the increase of the etching gas supply rate to promote etching.

The density gradient of $SiCl_2$ at a position corresponding to the position of the wafer with respect to the direction of the Z-axis and corresponding to the space surrounding the wafer with respect to the direction of the r-axis increases with the increase of the etching gas supply rate, which is considered to be a cause of the high etch rate in the peripheral part of the wafer because $SiCl_2$ is removed quickly from the peripheral part of the wafer when the etching gas supply rate is high.

The flow field of the etching gas will be examined. FIGS. 7A, 7B, 8A and 8B show the distributions of flowing velocity of the etching gas around the wafer for cases where etching gas supply rates are 1000 sccm, 500 sccm, 250 sccm and 125 sccm, respectively. As is obvious from FIGS. 7A, 7B, 8A and 8B, the velocity of flow of chlorine atoms Cl, i.e., etchant, is high when the etching gas supply rate is high, which is another reason the etch rate increases as the etching gas supply rate increases.

Figure 7A:
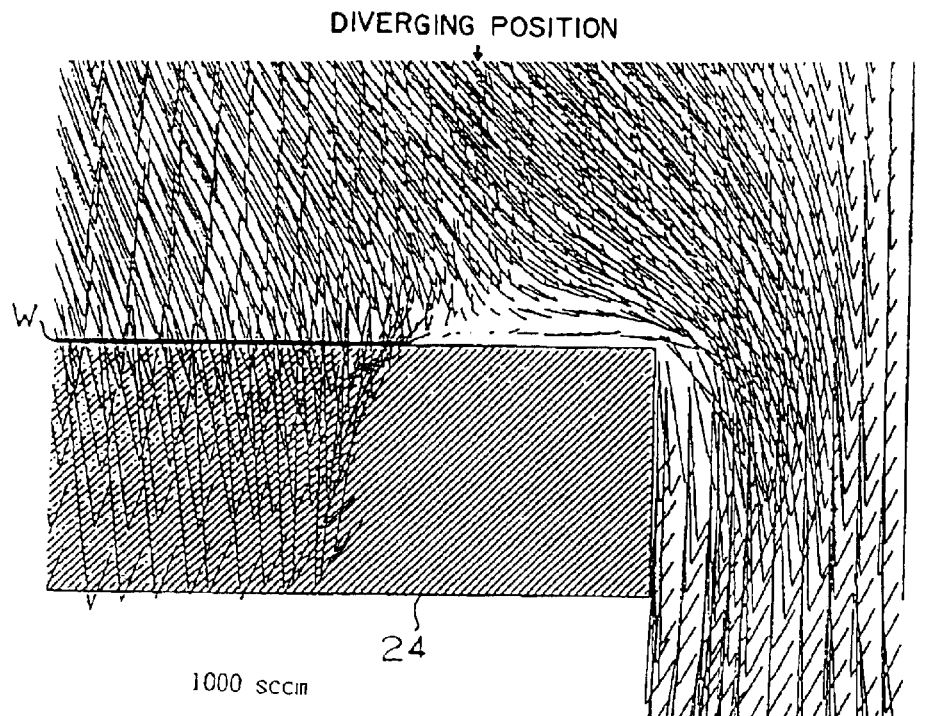
FIGS. 7A and 7B are views showing the distribution of flow velocity of an etchant around a peripheral part of a wafer.
Figure 7B:
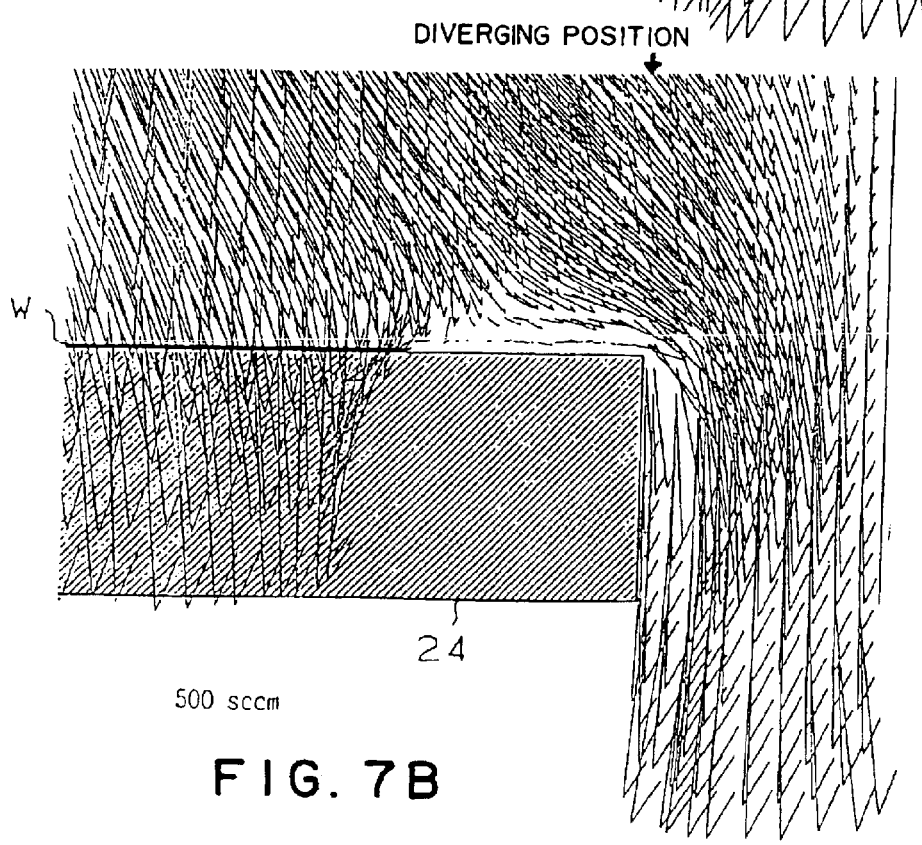
Figure 8A:
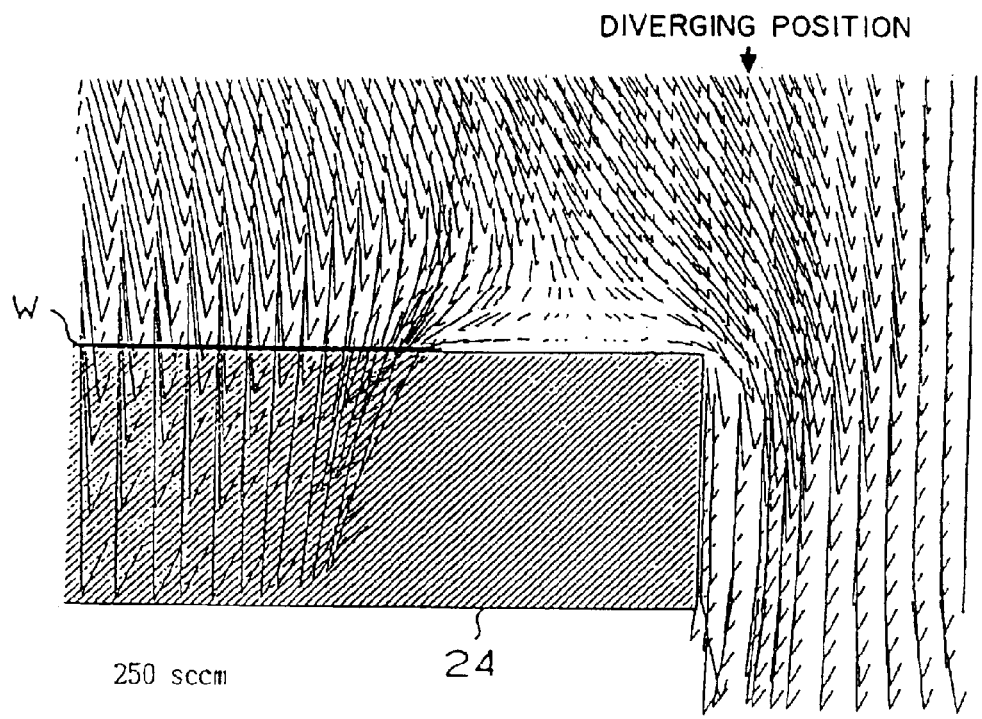
FIGS. 8A and 8B are views showing the distribution of flow velocity of an etchant around a peripheral part of a wafer.
Figure 8B:
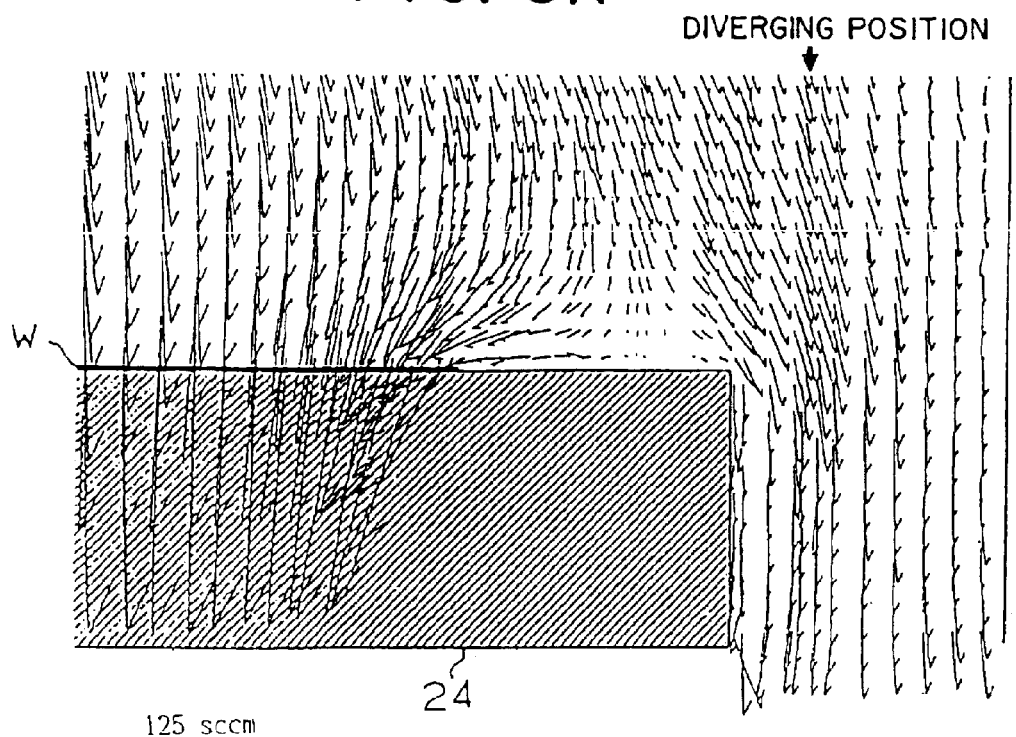

The flow of etchant is divided at a diverging position near the peripheral part of the wafer as shown in FIG. 7A when the etching gas supply rate is high. The diverging position shifts radially outward as the etching gas supply rate decreases, and the diverging position is substantially outside the wafer as shown in FIG. 8B when the etching gas supply rate is 125 sccm. It is known that such an outside diverging position is a cause to produce the strong flow of the etching gas toward the central part of the wafer and to increase the etch rate in the peripheral part of the wafer when the etching gas supply rate is low. Therefore, increase in the etch rate in the peripheral part of the wafer can be suppressed when the etching gas supply rate is high as shown in FIGS. 7A and 7B and, consequently, the uniformity of etch rate over the surface of the wafer can be improved.

Although the etching method of the present invention has been described as carried out by the inductive coupled plasma etching system (ICP etching system), it goes without saying that the etching method of the present invention can be carried out by a capacitive coupled plasma etching system (CCP etching system), and an electron cyclotron resonance plasma etching system (ECR plasma etching system).

The etching gas is not limited to chlorine gas, but may be, for example, CIF gas or the like. The object to be processed is not limited to the semiconductor wafer, but may be a LCD panel or the like.

What is claimed is:

1. An etching method comprising:
   an etching gas supply step of supplying an etching gas through a gas supply system into a plasma producing chamber;
   a plasma producing step of producing radicals in the plasma producing chamber by converting the etching gas into a plasma by applying radio frequency power to the etching gas; and
   an etching step of etching an object to be processed in a reaction chamber, which is connected to the plasma producing chamber and is evacuated, by the radicals flowing from the plasma producing chamber into the reaction chamber;
   wherein the etching gas is supplied through the gas supply system at an etching gas supply rate of 8.4 sccm or above for a substantial volume of one liter of the reaction chamber, a flow of etchant is provided at a flow rate which produces a flow diverging position with respect to an outer periphery of an object being etched that is substantially at or internal to the outer periphery of the object being etched,
   the process pressure is about 5 to about 10 mTorr, and wherein the plasma producing step converts the etching gas into a plasma by inductive coupling using an induction coil.

2. The etching method according to claim 1 wherein the process pressure is 5 mTorr.

3. The etching method according to claim 1 wherein the etching gas supply rate is 250 sccm or more.

4. The etching method according to claim 1 wherein the etching gas supply rate is 500 sccm or more.

5. The etching method according to claim 1 wherein the etching gas supply rate is from 250 sccm to 1000 sccm.

6. The etching method according to claim 1 wherein the etching gas supply rate is from 500 sccm to 1000 sccm.

7. The etching method according to claim 1 wherein said etching method is carried out on a 12-inch wafer.

8. The etching method according to claim 1 wherein the etching gas type is limited to chlorine gas.

9. The etching method according to claim 1 wherein etching gas is passed through a shower head before contact with the substrate.

10. The etching method according to claim 1 wherein the support supporting the object being etched is free of an electrode for pulling ions.

11. The etching method according to claim 1, wherein the etching gas supply rate is 8.4 sccm to 16.9 sccm for a substantial volume of one liter of the reaction chamber.

12. The etching method according to claim 11, wherein a flow of etchant is provided at a flow rate which produces a flow diverging position that is internal to an outer periphery of an object being etched.

13. The etching method according to claim 1, wherein the etching step uses chlorine gas as the etching gas and etches a polysilicon film formed on the object to be processed.

14. The etching method according to claim 11, wherein the etching gas supply rate is 8.4 sccm to 16.9 sccm for a substantial volume of one liter of the reaction chamber.

15. The etching method according to claim, 13, wherein a flow of etchant is provided at a flow rate which produces a flow diverging position that is internal to an outer periphery of an object being etched.

16. An etching method, comprising:
    an etching gas supply step of supplying an etching gas through a gas supply system into a plasma producing chamber;
    a plasma producing step of producing radicals in the plasma producing chamber by converting the etching gas into a plasma by applying radio frequency power to the etching gas; and
    an etching step of etching an object to be processed in a reaction chamber, which is connected to the plasma producing chamber and is evacuated, by the radicals flowing from the plasma producing chamber into the reaction chamber;
    wherein the etching gas is supplied through the gas supply system at an etching gas supply rate of 8.4 sccm or above for a substantial volume of one liter of the reaction chamber,
    the plasma producing step converts the etching gas into a plasma by inductive coupling using an induction coil, and
    a flow of etchant is provided at a flow rate which produces a flow diverging position with respect to an outer periphery of an object being etched that is substantially at or internal to the outer periphery of the object being etched.

17. The etching method according to claim 16, wherein the etching gas supply rate is 8.4 sccm to 16.9 sccm for a substantial volume of one liter of the reaction chamber.

18. The etching method according to claim 16, wherein the etching gas supply rate is 8.4 sccm to 16.9 sccm for a substantial volume of one liter of the reaction chamber.

19. The etching method according to claim 18, wherein a flow of etchant is provided at a flow rate which produces a flow diverging position that is internal to an outer periphery of an object being etched.

20. The etching method according to claim 16 wherein the process pressure is about 5 to about 10 mTorr.

21. The etching method according to claim 20 wherein the process pressure is 5 mTorr.

22. The etching method according to claim 16, wherein the etching step uses chlorine gas as the etching gas and etches a polysilicon film formed on the object to be processed.

23. The etching method according to claim 22, wherein a flow of etchant is provided at a flow rate which produces a flow diverging position that is internal to an outer periphery of an object being etched.

24. The etching method according to claim 22 wherein the process pressure is about 5 to about 10 mTorr.

25. An etching method comprising:
    an etching gas supply step of supplying an etching gas through a gas supply system into a plasma producing chamber;
    a plasma producing step of producing radicals by converting the etching gas into a plasma by induction coupling within the plasma producing chamber; and
    an etching step of etching an object to be processed in a reaction chamber of a larger dimension than said plasma producing chamber, which plasma chamber is connected to the plasma producing chamber and is evacuated, by the radicals that diffuse from the plasma producing chamber into the reaction chamber;
    wherein the etching gas is supplied through the gas supply system at an etching gas supply rate of 8.4 sccm or above for a substantial volume of one liter of the reaction chamber, and wherein the etching gas and radicals flow down to an object being etched, and the flow of etchant is provided at a flow rate which produces a flow diverging position with respect to an outer periphery of an object being etched that is substantially at or internal to the outer periphery of the object being etched, and the process pressure is about 5 to about 10 mTorr.

26. The etching method according to claim 25, wherein the etching gas supply rate is 250 sccm or more.

27. The etching method according to claim 25 wherein the etching gas supply rate is 500 sccm or more.

28. The etching method according to claim 25 wherein the etching gas supply rate is from 250 sccm to 1000 sccm.

29. The etching method according to claim 25 wherein the etching gas supply rate is from 500 sccm to 1000 sccm.

30. The etching method according to claim 25 wherein said etching method is carried out on a 12-inch wafer.

31. The etching method according to claim 25 wherein the etching gas type is limited to chlorine gas.

32. An etching method comprising:
   an etching gas supply step of supplying an etching gas through a gas supply system into a plasma producing chamber;
   a plasma producing step of producing radicals in the plasma producing chamber by converting the etching gas into a plasma by applying radio frequency power to the etching gas; and
   an etching step of etching an object to be processed in a reaction chamber, which is connected to the plasma producing chamber and is evacuated, by the radicals flowing from the plasma producing chamber into the reaction chamber;
   wherein the etching gas is supplied through the gas supply system at an etching gas supply rate of 8.4 sccm or above for a substantial volume of one liter of the reaction chamber, and wherein the flow of etching gas is provided at a flow rate of 250 sccm to 1000 sccm.

33. The method of claim 8 wherein the flow rate is 500 sccm to 1000 sccm.

34. An etching method comprising:
   an etching gas supply step of supplying an etching gas through a gas supply system into a plasma producing chamber;
   a plasma producing step of producing radicals in the plasma producing chamber by converting the etching gas into a plasma by applying radio frequency power to the etching gas; and
   an etching step of etching an object to be processed in a reaction chamber, which is connected to the plasma producing chamber and is evacuated, by the radicals flowing from the plasma producing chamber into the reaction chamber;
   wherein the etching gas is supplied through the gas supply system at an etching gas supply rate of 8.4 sccm or above for a substantial volume of one liter of the reaction chamber, and wherein the flow of etching gas is provided at a flow rate of 500 sccm or above.

* * * * *